(12) United States Patent
Loke et al.

(10) Patent No.: US 8,466,536 B2
(45) Date of Patent: Jun. 18, 2013

(54) SHIELD-MODULATED TUNABLE INDUCTOR DEVICE

(75) Inventors: Alvin Leng Sun Loke, Fort Collins, CO (US); Tin Tin Wee, Fort Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 270 days.

(21) Appl. No.: 12/904,812

(22) Filed: Oct. 14, 2010

(65) Prior Publication Data

US 2012/0091558 A1  Apr. 19, 2012

(51) Int. Cl.
*H01L 27/08* (2006.01)
*H01L 29/86* (2006.01)

(52) U.S. Cl.
USPC ............. 257/531; 257/277; 257/E21.022

(58) Field of Classification Search
USPC .................................. 257/277, 531
See application file for complete search history.

(56) References Cited

U.S. PATENT DOCUMENTS

| | | | |
|---|---|---|---|
| 6,642,540 B2 | 11/2003 | Komurasaki et al. | |
| 7,061,072 B2 | 6/2006 | Blanchard et al. | |
| 2001/0013626 A1 | 8/2001 | Fujii | |
| 2002/0158306 A1 | 10/2002 | Niitsu | |
| 2005/0012176 A1 | 1/2005 | Arnborg | |
| 2005/0247999 A1 | 11/2005 | Nishikawa et al. | |
| 2005/0258507 A1 * | 11/2005 | Tseng et al. | 257/531 |
| 2009/0146636 A1 | 6/2009 | Nakajima | |
| 2009/0250262 A1 | 10/2009 | Jin | |
| 2010/0019300 A1 * | 1/2010 | Yu et al. | 257/296 |
| 2011/0134713 A1 * | 6/2011 | Givant et al. | 365/210.1 |

FOREIGN PATENT DOCUMENTS

| | | |
|---|---|---|
| JP | 08162331 A | 6/1996 |
| JP | 2005064263 A | 3/2005 |
| WO | 2008025759 A1 | 3/2008 |

OTHER PUBLICATIONS

Partial International Search Report issued Jan. 17, 2012 in PCT/US2011/056184.
PCT International Preliminary Report on Patentability, and PCT Written Opinion for International Application No. PCT/US2011/056184, mailed Apr. 25, 2013.

* cited by examiner

*Primary Examiner* — Ha Tran T Nguyen
*Assistant Examiner* — Raj R Gupta
(74) *Attorney, Agent, or Firm* — Ingrassia Fisher & Lorenz, P.C.

(57) ABSTRACT

A semiconductor device is presented here. The semiconductor device includes an integrated inductor formed on a semiconductor substrate, a transistor arrangement formed on the semiconductor substrate to modulate loop current induced by the integrated inductor, dielectric material to insulate the integrated inductor from the transistor arrangement, and a controller coupled to the transistor arrangement. The controller is used to select conductive and nonconductive operating states of the transistor arrangement. A conductive operating state of the transistor arrangement allows formation of induced loop current in the transistor arrangement, and a nonconductive operating state of the transistor arrangement inhibits formation of induced loop current in the transistor arrangement.

26 Claims, 4 Drawing Sheets

SHIELD-MODULATED TUNABLE INDUCTOR DEVICE

TECHNICAL FIELD

Embodiments of the subject matter described herein relate generally to integrated inductor devices. More particularly, embodiments of the subject matter relate to an integrated inductor device having a tunable inductance.

BACKGROUND

Monolithically integrated inductor devices formed on semiconductor substrates are well known. An integrated inductor device employs a conductive loop (having one or more turns) fabricated from one or more appropriate metal interconnect layers on the semiconductor substrate. In some applications, a solid or continuous ground shield resides below and/or above the conductive inductor loop to electrically isolate the inductor from noisy electromagnetic fields that might be generated by other nearby devices in the shared substrate or conductive elements in the device package.

Solid or continuous inductor ground shields may be undesirable in certain applications, such as integrated inductors for resonant oscillators. In such applications, magnetically induced eddy current loops will be generated in the solid shields. The resulting eddy current loops in the solid shield produce magnetic flux that, in accordance with Lenz's law, counters the magnetic flux produced by the inductor, thereby reducing the overall effective inductance of the inductor device. To address this reduction in effective inductance for an allocated inductor area, patterned or slotted shields are commonly used. A patterned ground shield typically includes metal "fingers" that are arranged to be orthogonal to the direction of the inductor loop so as to inhibit the formation of eddy current loops. As a result, these fingers are magnetically transparent yet provide adequate electric field isolation of the inductor from offending substrate noise.

Moreover, integrated inductors used in circuits such as resonant oscillators are usually not tunable (at least within a practical range of inductance)—frequency tuning is typically achieved only with capacitive tuning. Wide frequency tuning in oscillators is highly desirable for synthesizing multiple frequency targets without the area cost of additional circuitry. Accordingly, compared to resonant oscillators, ring oscillators typically exhibit wider tuning range, but their relatively noisier or higher jitter performance characteristic renders them unusable in meeting more stringent frequency or clock synthesis specifications.

Accordingly, it is desirable to have a tunable, integrated inductor device that has a usable and practical inductance range. Furthermore, other desirable features and characteristics will become apparent from the subsequent detailed description and the appended claims, taken in conjunction with the accompanying drawings and the foregoing technical field and background.

BRIEF SUMMARY OF EMBODIMENTS

A semiconductor device is provided. The semiconductor device includes a layer of semiconductor material, gate structures formed overlying the layer of semiconductor material, and an active region defined in the layer of semiconductor material. The active region has source regions and drain regions such that the gate structures, the source regions, and the drain regions cooperate to form field effect transistors for the semiconductor device. The semiconductor device also includes a layer of dielectric material formed overlying the gate structures and overlying the active region, and a conductive inductor loop formed overlying the layer of dielectric material. The field effect transistors are controlled to modulate the inductance associated with the overlying conductive inductor loop.

An integrated inductor device is also provided. The inductor device includes a conductive inductor loop, a transistor arrangement, and dielectric material between the conductive inductor loop and the transistor arrangement. The transistor arrangement includes a continuous ring-shaped region of active semiconductor material having source regions and drain regions defined therein, and gate structures orthogonally overlying the continuous ring-shaped region of active semiconductor material. The transistor arrangement serves as a voltage-modulated shield for the integrated inductor device, where the voltage-modulated shield influences an inductance of the integrated inductor device.

Also provided is a semiconductor device having an integrated inductor formed on a semiconductor substrate, a transistor arrangement formed on the semiconductor substrate to modulate loop current induced by the integrated inductor, dielectric material to insulate the integrated inductor from the transistor arrangement, and a controller coupled to the transistor arrangement to select conductive and nonconductive operating states of the transistor arrangement. A conductive operating state of the transistor arrangement allows formation of induced loop current in the transistor arrangement, and a nonconductive operating state of the transistor arrangement inhibits formation of induced loop current in the transistor arrangement.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
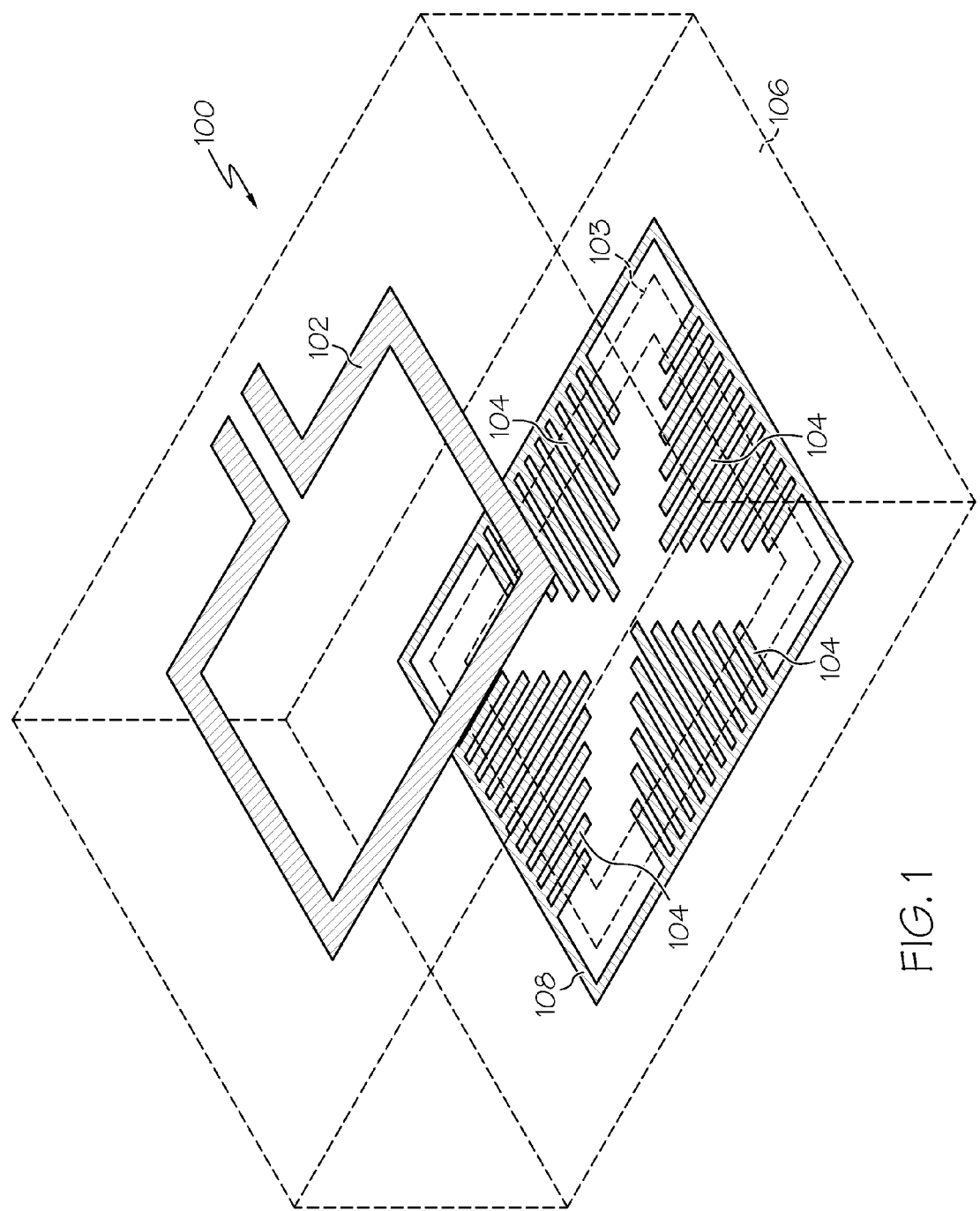
FIG. 1 is a perspective phantom view of an exemplary embodiment of a semiconductor device having a shield-modulated integrated inductor.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first", "second", and other such numerical terms referring to structures do not imply a sequence or order unless clearly indicated by the context.

For the sake of brevity, conventional techniques related to semiconductor device fabrication may not be described in detail herein. In particular, various steps in the manufacture of semiconductor based transistors and integrated inductors are well known and so, in the interest of brevity, many conventional steps will only be mentioned briefly herein or will be omitted entirely without providing the well known process details.

The following description relates to an integrated inductor device that is formed on a semiconductor substrate. The integrated inductor device exploits the electromagnetic characteristics of solid inductor shields versus patterned inductor shields. In this regard, a solid or continuous ground shield will reduce the inductance of the inductor (due to the presence of induced eddy current loops in the shield), while a radially arranged patterned shield (given its transparency to magnetic fields) has little to no effect on the nominal inductance. Accordingly, the integrated inductor device described here incorporates a "shield" that is fabricated from a plurality of transistors arranged in a ring below the overlying conductive turn(s) of the inductor loop. The transistors are fabricated such that their gate structures are orthogonal to the turns of the inductor, in a manner akin to the metal fingers of a traditional patterned shield. Moreover, the active semiconductor regions of the transistors form a continuous ring below the footprint of the conductive inductor loop.

When the transistors are switched off (i.e., they do not conduct current) using the appropriate gate voltage, the transistor arrangement behaves in a manner similar to a patterned shield. In other words, the nonconductive nature of the active semiconductor material under the gate material inhibits the formation of an induced eddy current loop in the "shield" and, therefore, the nominal inductance of the overlying coil remains substantially undisturbed. On the other hand, when the transistors are switched on (i.e., they conduct current), the transistor arrangement behaves in a manner similar to a solid shield. Thus, the conductive nature of the active semiconductor material under the gate material promotes or allows the formation of a continuous induced eddy current loop in the "shield" in response to the magnetic flux produced by the overlying inductor and, therefore, the nominal inductance of the coil is reduced.

The general approach summarized above can be extended by forming a plurality of independently controllable transistor arrangements, preferably corresponding to different turns of the inductor coil. This allows enhanced tuning of the amount of induced loop current below the inductor coil and, therefore, enhanced tuning of the inductance.

Turning now to the figures, a perspective phantom view of an exemplary embodiment of a semiconductor device 100 having a shield-modulated integrated inductor is shown in FIG. 1. The semiconductor device 100 is illustrated in a simplified manner, and an implementation of the semiconductor device 100 will usually include additional elements, circuit components, conductive interconnects, conductive plugs, and other conventional features. The semiconductor device 100 is fabricated on a semiconductor substrate (not shown in FIG. 1), and transistors of the semiconductor device 100 are formed in the semiconductor material of the semiconductor substrate. In this regard, the transistors of the semiconductor device 100 may be realized as NMOS transistor devices and/or PMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The semiconductor device 100 generally includes, without limitation: a conductive inductor loop 102; an active region 103 defined in a layer of semiconductor material; gate structures 104; and a layer of dielectric material 106. FIG. 1 depicts the layered arrangement of these elements—the layer of dielectric material 106 is formed overlying the gate structures 104 and overlying the active region 103, and the conductive inductor loop 102 is formed overlying the layer of dielectric material 106.

The conductive inductor loop 102 is formed from a suitable material, typically a metal. In accordance with known semiconductor device fabrication processes, the material used for the conductive inductor loop 102 can, for example, be deposited and etched into the desired pattern. In practice, the most (if not all) of the conductive inductor loop 102 will reside in a single interconnect plane. Although FIG. 1 depicts a simple conductive inductor loop 102 having a single turn, other embodiments may include a plurality of turns formed using one or more interconnect planes. It should be appreciated that air bridges or similar routing techniques and interconnect technologies may be utilized to fabricate an integrated inductor coil with multiple turns.

The conductive inductor loop 102 may be formed on or overlying the layer of dielectric material 106. In practice, the layer of dielectric material 106 can be formed from one or more materials commonly used as insulators in the semiconductor industry, such as silicon oxides, silicon nitrides, or low-permittivity open-structure organic glasses. The layer of dielectric material 106 electrically insulates the conductive inductor loop 102 from the underlying features (the gate structures 104 and the active region 103).

Figure 3:
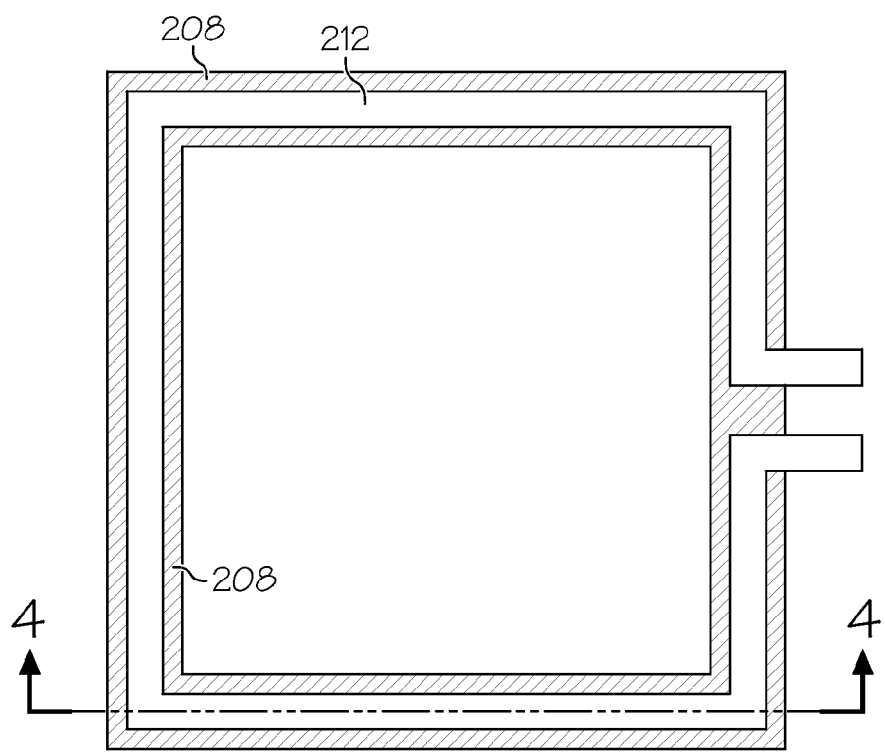
FIG. 3 is another top view of the semiconductor device shown in FIG. 2, with some features removed for ease of illustration.
Figure 4:
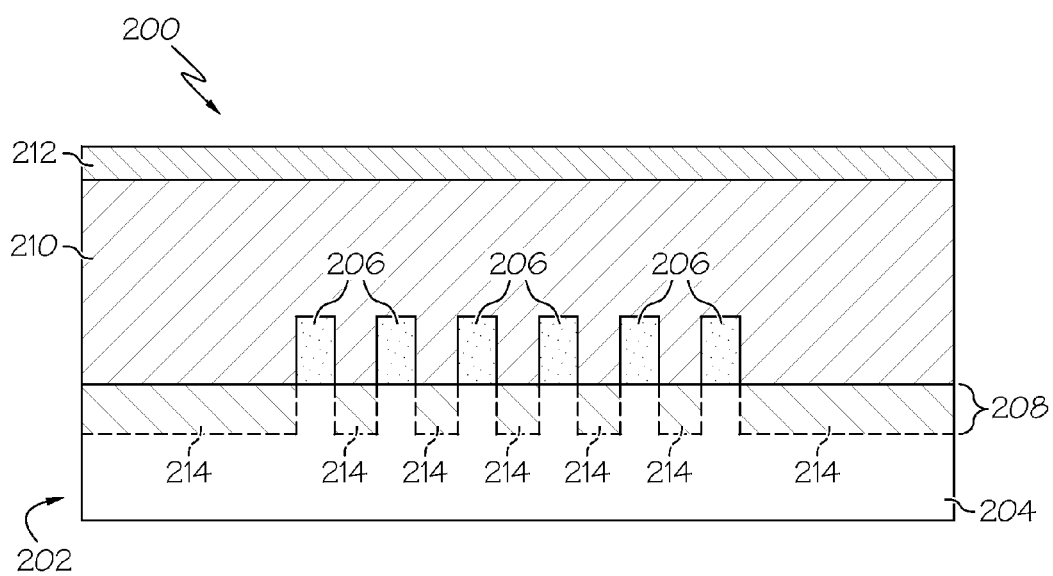
FIG. 4 is a simplified cross-sectional view of the semiconductor device shown in FIG. 2 and FIG. 3.

As described in more detail below with reference to FIGS. 2-4, the active region 103 includes conductive source regions and drain regions defined therein, such that the gate structures 104, the source regions, and the drain regions cooperate to form field effect transistors (e.g., MOSFETs) for the semiconductor device 100. FIG. 1 is a simplified rendering that illustrates the outline or footprint of the active region 103 in dashed lines (because the active region 103 resides below the surface upon which the gate structures 104 are formed). For this particular embodiment, the gate structures 104 resemble protruding "fingers" that extend inward towards the center of the interior area defined by the active region 103. Notably, each of the gate structures extends completely over and across the underlying active region 103 (this aspect is important for reasons that will be become apparent). Moreover, each of the gate structures 104 has a major longitudinal axis that is perpendicular to the conductive inductor loop 102.

In certain implementations, all of the gate structures 104 are electrically connected together such that they share a common gate voltage. As shown in FIG. 1, the gate structures 104 may be coupled together using a conductive trace 108, interconnects, conductive plugs, or the like. Moreover, one or more conductive plugs, interconnects, or other electrical contact features may be utilized to provide gate, source, and drain voltages as needed for operation of the semiconductor device 100.

It should be appreciated that the particular layout, shape, size, and configuration of elements depicted in FIG. 1 (and the other figures) are merely exemplary. Indeed, many different configurations and layouts can be fabricated and used without departing from the general scope of the described subject matter. For example, the conductive inductor loop 102 need not be rectangular in shape, and it need not include only one turn. Moreover, the number of gate structures 104, the arrangement of the individual gate structures 104, and/or the dimensions of the active region 103 may vary from one embodiment to another.

Moreover, physical embodiments of the invention described here can be realized using existing semiconductor fabrication techniques and computer-implemented design tools. For example, hardware description language code, netlist techniques, or the like may be utilized to generate GDS II (or similar) data files associated with various layout characteristics of the semiconductor device 100. In this regard, such data files can be used to generate layout designs for the masks utilized by the fabrication facility to actually manufacture the semiconductor device 100. In practice, the GDS II or other data files used in this context can be stored on any suitable computer readable media, as is well understood.

Figure 2:
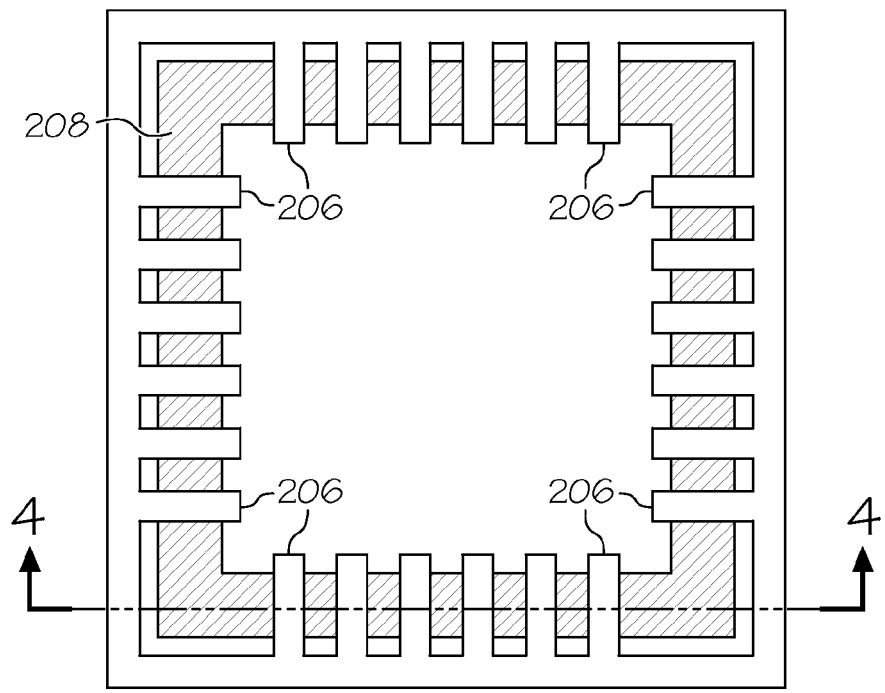
FIG. 2 is a top view of an exemplary embodiment of a semiconductor device having a shield-modulated integrated inductor, with some features removed for ease of illustration.

FIG. 2 is a top view of another exemplary embodiment of a semiconductor device 200 having a shield-modulated integrated inductor, with some features removed for ease of illustration. FIG. 3 is an alternate top view of the semiconductor device 200, with other features removed for ease of illustration, and FIG. 4 is a cross-sectional view of the semiconductor device 200 shown in FIG. 2 and FIG. 3 (as viewed from the line 4-4). Referring to FIG. 4, the semiconductor device 200 is formed on a semiconductor substrate 202 having a layer of semiconductor material 204. The semiconductor material 204 is preferably a silicon material as typically used in the semiconductor industry, e.g., relatively pure monocrystalline silicon as well as silicon admixed with other elements such as germanium, carbon, and the like. Alternatively, the semiconductor material 204 can be germanium, gallium arsenide, or the like. The semiconductor material 204 can be either N-type or P-type, but is typically P-type, with wells of the appropriate type formed therein. The semiconductor material 204 may be provided as a bulk semiconductor substrate, or it could be provided on a silicon-on-insulator (SOI) substrate, which includes a support substrate, an insulator layer on the support substrate, and a layer of silicon material on the insulator layer in which the transistors are fabricated.

The semiconductor device 200 includes gate structures 206 formed overlying the layer of semiconductor material 204. The semiconductor material 204 includes an active region 208 defined therein. The gate structures 206 can be fabricated using well known techniques and process steps related to material deposition, photolithography, cleaning, polishing, etching, and the like. For simplicity, the gate structures 206 are shown as simple blocks in FIG. 4; in practice, each gate structure 206 may be fabricated using a plurality of different layers. The gate structures 206 are also visible in FIG. 2, which depicts the orthogonal relationship between each of the gate structures 206 and the active region 208. Moreover, it should be apparent from FIG. 2 and FIG. 3 that the conductive inductor loop 212 orthogonally overlies the gate structures 206.

The semiconductor device 200 also includes dielectric material 210 formed overlying the gate structures 206 and overlying certain exposed areas of the semiconductor material 204, and a conductive inductor loop 212 formed overlying the dielectric material 210. The conductive inductor loop 212 is also shown in FIG. 3. Notably, FIG. 3 illustrates the relationship between the footprint of the conductive inductor loop 212 and the active region 208. In particular, the projection of the conductive inductor loop 212 onto a reference plane (that is parallel to the plane in which the conductive inductor loop 212 resides) falls within the projection of the active region 208 onto the reference plane. In other words, when viewed from the top (or the bottom) of the semiconductor device 200, the conductive inductor loop 212 "fits" within the active region 208. Thus, the boundaries of the active region 208 are dimensioned to accommodate the size and shape of the conductive inductor loop 212.

The semiconductor device 200 employs a transistor arrangement that serves as a voltage-modulated shield for the integrated inductor. More specifically, the transistor arrangement is controlled so that the voltage-modulated shield influences the inductance of the integrated inductor. Referring again to FIG. 4, the transistor arrangement includes the continuous and contiguous ring-shaped active region 208 (which has source and drain regions 214 defined therein) and the gate structures. Thus, the dielectric material 210 insulates the conductive inductor loop 212 from the transistor arrangement. In accordance with conventional transistor design and fabrication techniques, the source and drain regions 214 can be formed by implanting ions of an appropriate impurity species into the semiconductor material 204 adjacent to the gate structures 206. The resulting field effect transistors of the transistor arrangement are coupled in series and are controlled to modulate the conductive and nonconductive characteristics of the active region 208, which in turn modulates the amount of eddy loop current induced in the active region 208 by the conductive inductor loop 212, which in turn modulates the inductance associated with the integrated inductor.

Figure 5:
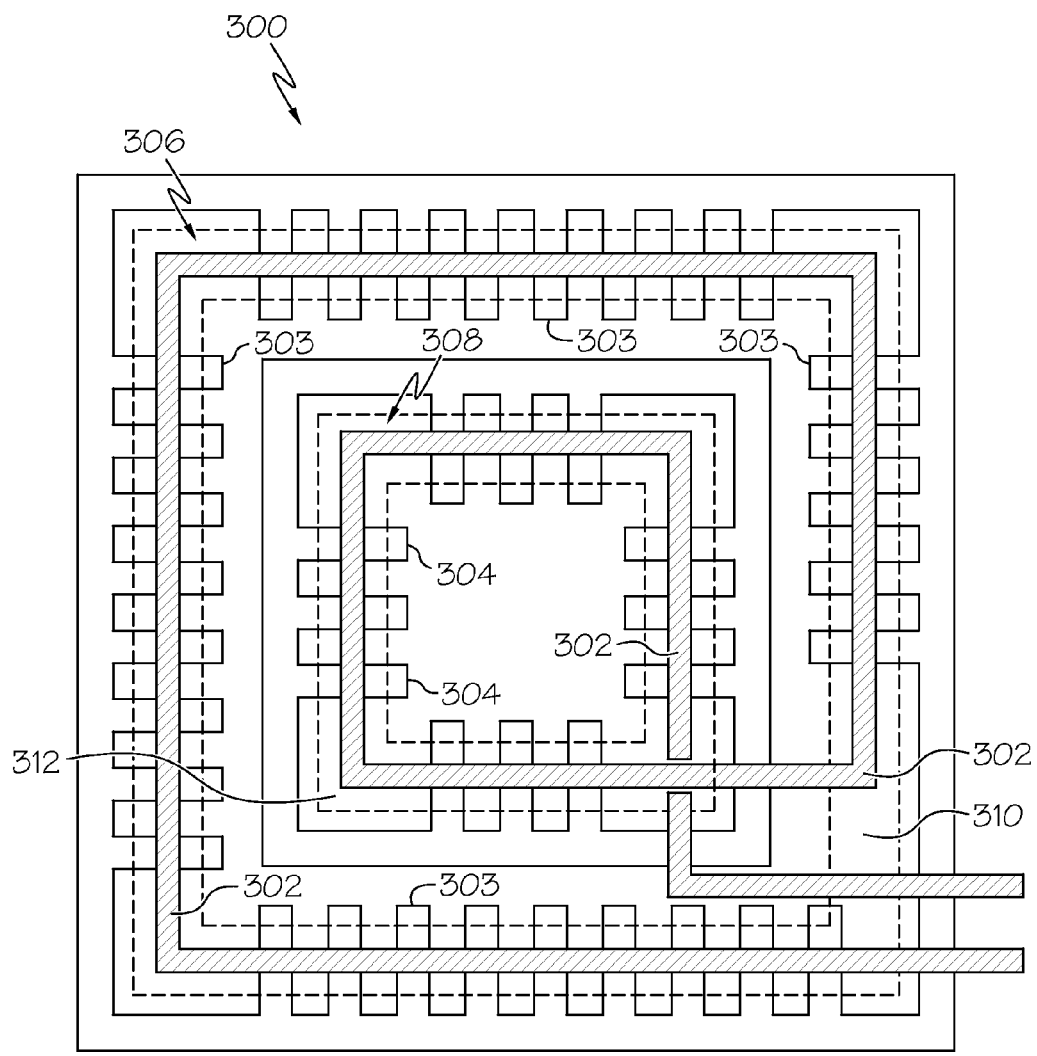
FIG. 5 is a top view of another exemplary embodiment of a semiconductor device having a shield-modulated integrated inductor, with some features removed for ease of illustration.

The semiconductor devices 100, 200 represent simple embodiments that utilize a single turn for the integrated inductor. In practice, the conductive inductor loop could have two or more turns if needed to achieve the desired nominal inductance. It should be appreciated that the techniques and technology described above for a single turn conductive loop can be extended to a multiple-turn loop. In this regard, FIG. 5 is a top view of another exemplary embodiment of a semiconductor device 300 having a shield-modulated integrated inductor, with some features removed for ease of illustration. For clarity and ease of illustration, FIG. 5 depicts the outline or footprint of a conductive inductor loop 302 and the outline or footprint of gate structures 303, 304 for the semiconductor device 300.

This particular embodiment includes two inductor turns. The conductive inductor loop 302 includes a first (outer) turn 306 and a second (inner) turn 308 that resides within the first turn 306. The conductive inductor loop 302 may include an underpass, an air bridge, or the like to accommodate the second turn 308 (so that the intersection depicted in FIG. 5 does not result in a short). Notably, each of the turns 306, 308 has a respective active region associated therewith. In this regard, FIG. 5 also shows (in dashed lines) a primary active region 310 corresponding to the first turn 306, and a secondary active region 312 corresponding to the second turn 308. These two active regions 310, 312 are independent, separated, and isolated from one another. The footprint of the primary active region 310 generally follows and encompasses most of the footprint of the first turn 306. Similarly, the footprint of the secondary active region 312 generally follows and encompasses most of the footprint of the second turn 308. In other words, the first turn 306 overlies one continuous ring-shaped region of active semiconductor material, and the second turn 308 overlies another continuous ring-shaped region of active semiconductor material. As explained above for the semiconductor devices 100, 200, each active region 310, 312 includes respective source and drain regions defined therein.

The gate structures 303, 304 are independent, separated, and isolated from one another. In particular, the gate structures 303 correspond to the first turn 306 and to the primary active region 310. On the other hand, the gate structures 304 correspond to the second turn 308 and to the secondary active region 312. For this particular embodiment, each of the gate structures 303 orthogonally overlies the primary active region 310, and each of the gate structures 304 orthogonally overlies the secondary active region 312. Thus, the semiconductor device 300 includes two distinct transistor arrangements: one transistor arrangement associated with the primary active region 310 and the gate structures 303, and another transistor arrangement associated with the secondary active region 312 and the gate structures 304. These two transistor arrangements can be independently controlled for purposes of tuning the inductance of the semiconductor device 300.

A tunable integrated inductor device of the type described here can be fabricated with appropriate electrical contacts, terminals, and/or conductive pads as needed to provide electrical connectivity to its conductive inductor loop, its gate structure(s), and its source and drain regions. Such contacts, terminals, and/or pads can be fabricated using conventional and well known semiconductor manufacturing techniques that will not be described in detail here. The electrical connections to the semiconductor device can be used to bias and control the operation of the transistor arrangement and/or the individual transistors of the semiconductor device, which in turn modulate the inductance of the integrated inductor of the semiconductor device. More specifically, the gate voltage (and, in certain embodiments the source voltage and/or the drain voltage) of the transistors can be controlled to activate/deactivate the transistors as needed.

Figure 6:
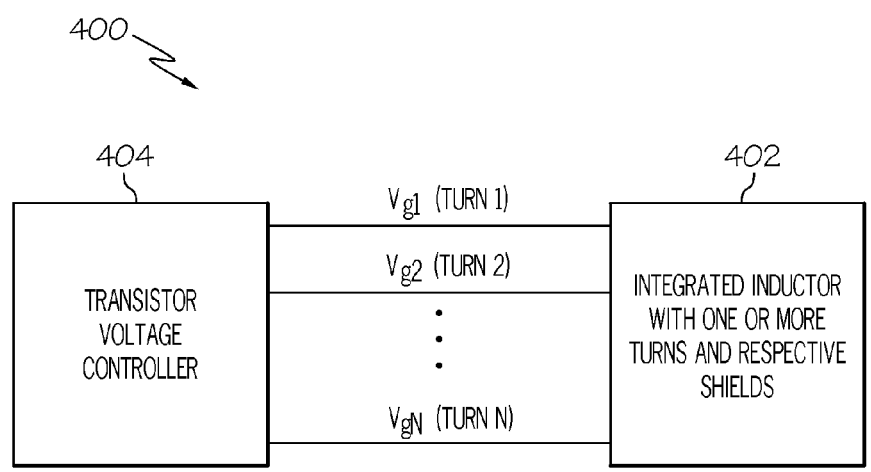
FIG. 6 is a schematic representation of an exemplary embodiment of a semiconductor device having a shield-modulated integrated inductor.

Each of the semiconductor devices 100, 200, 300 may employ a suitably configured transistor voltage controller to control the conductive and nonconductive states of the transistors. In this regard, FIG. 6 is a schematic representation of an exemplary embodiment of a semiconductor device 400 having a shield-modulated integrated inductor 402 and a transistor voltage controller 404 coupled to one or more transistors of the semiconductor device 400. The conductive loop of the integrated inductor 402 has one or more turns and a corresponding number of "shields" having conductive and nonconductive states that are modulated using transistor arrangements as described previously. In certain embodiments, the transistor voltage controller 404 is coupled to the gate structures associated with the integrated inductor 402 to modulate a common gate voltage for the gate structures. For such embodiments, the source regions and the drain regions may be connected to a fixed reference or bias voltage, such as ground. In other embodiments, the transistor voltage controller 404 is coupled to the gate structures and to either the source region, the drain region, or both the source and drain regions to provide the appropriate gate, source, and/or drain voltages.

FIG. 6 depicts a generalized semiconductor device 400 that can accommodate any number of distinct transistor arrangements corresponding to a conductive inductor loop having any number of turns. Thus, a first gate voltage (Vg1) may be utilized to control the common gate voltage for a first group of transistors in a first transistor arrangement, a second gate voltage (Vg2) may be used to independently control the common gate voltage for another group of transistors in a second transistor arrangement, and so on. The first gate voltage may be associated with the first turn or first group of turns of the integrated inductor, the second gate voltage may be associated with the second turn or second group of turns of the integrated inductor, and so on.

In operation, the transistor voltage controller 404 biases its respective transistors into their conductive states to allow current to flow in the channels of the transistors. This effectively transforms the active region of semiconductor material (in which the respective source and drain regions reside) into a conductive path. The conductive path allows the conductive inductor loop to induce loop current in the conductive active region. In contrast, the transistor voltage controller 404 can bias the transistors into their nonconductive states to inhibit the conductive inductor loop from inducing loop current in the nonconductive active region. This effectively transforms the active region of semiconductor material into a nonconductive path. To minimize the formation of smaller loop currents induced within the active region for this state, the gate structures are fabricated such that they completely span the width of the active region. Otherwise, current will leak around the channel region defined under the gate structures. In a multiple-turn embodiment, the transistor voltage controller 404 independently controls the conductive and nonconductive states of a plurality of distinct, separate, and isolated active regions by independently modulating the gate voltages of the different transistor arrangements.

The transistor voltage controller 404 can be used to select different conductive and nonconductive operating states of the transistor arrangement(s) of the semiconductor device 400. For example, a single-turn integrated inductor will have one conductive state and one nonconductive state, respectively corresponding to the transistor on and off states. A double-turn integrated inductor, on the other hand, could be controlled to assume one of four potential states: a fully conductive state where both active regions are conducting; a nonconductive state where both active regions are not conducting; a first partially conductive/nonconductive state where the primary active region is conducting and the secondary active region is not conducting; and a second partially conductive/nonconductive state where the primary active region is not conducting and the secondary active region is conducting.

In practice, the transistor voltage controller 404 could be operated in a dynamic manner to modulate the inductance of the integrated inductor device in an ongoing and real-time manner if so desired. Alternatively, the transistor voltage controller 404 could be utilized to tune the integrated inductor device as desired and then "fix" the applied transistor voltages such that the tuned inductance is maintained.

The operation of the semiconductor devices 100, 200, 300, 400 will now be described. It is well established that current flowing through a conductive loop produces a magnetic field in the area defined by the loop, which in turn influences the inductance of the loop. If the conductive loop is shielded with a solid conductive ground plane, the current flowing through the loop induces an opposite loop current in the conductive shield. The induced loop current produces its own magnetic field, which opposes the magnetic field generated by the conductive inductor loop. Thus, the total magnetic flux associated with the inductor is reduced by an amount corresponding to the magnetic flux produced by the induced loop current. Consequently, the effective inductance of the inductor is also reduced.

The transistor arrangements in the semiconductor devices 100, 200, 300, 400 are controlled such that they function as voltage-modulated shields having variable conductive characteristics. For the simple one-turn embodiment, therefore, the transistor arrangement functions in a manner akin to a solid shield when the transistors are conducting (and an induced eddy current loop is established). In contrast, the transistor arrangement functions in a manner akin to a patterned shield when the transistors are not conducting (and an induced eddy current loop is not established). In accordance with the same general operating principles, a multiple-turn embodiment can be controlled to assume a plurality of different states with a corresponding plurality of different effective inductances.

While at least one exemplary embodiment has been presented in the foregoing detailed description, it should be appreciated that a vast number of variations exist. For example, although the figures depict embodiments having a plurality of transistors arranged in a ring-like pattern corresponding to the inductor loop, only one (or only a few) transistors could be utilized to inhibit formation of an eddy current loop and to obtain some of the benefits described herein. As another example, an active region could be realized as a plurality of active region segments coupled together using another conductive material or element, such as a metal interconnect feature. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a layer of semiconductor material;
gate structures formed overlying the layer of semiconductor material;
a first continuous ring-shaped active region defined in the layer of semiconductor material including field effect transistors for the semiconductor device;
a layer of dielectric material formed overlying the gate structures and overlying the first continuous ring-shaped active region;
a conductive inductor loop formed overlying the layer of dielectric material, wherein the field effect transistors are controlled to modulate inductance associated with the conductive inductor loop;
a secondary ring-shaped region of active semiconductor material that is isolated from the first continuous ring-shaped active region defined in the layer of semiconductor material, the secondary ring-shaped region of active semiconductor material having secondary source and secondary drain regions defined therein; and
secondary gate structures orthogonally overlying the secondary ring-shaped region of active semiconductor material;
wherein:
the conductive inductor loop comprises a first turn and a second turn;
the first turn overlies the first continuous ring-shaped region of active semiconductor material; and
the second turn overlies the secondary ring-shaped region of active semiconductor material.

2. The semiconductor device of claim 1, wherein each of the gate structures has a major longitudinal axis that is perpendicular to the conductive inductor loop.

3. The semiconductor device of claim 1, wherein:
the conductive inductor loop resides in a first plane; and
a projection of the conductive inductor loop onto a reference plane that is parallel to the first plane falls within a projection of the first continuous ring-shaped active region onto the reference plane.

4. The semiconductor device of claim 1, wherein each of the plurality of gate structures extends completely over and across the first continuous ring-shaped active region.

5. The semiconductor device of claim 1, further comprising a transistor voltage controller coupled to the field effect transistors to control conductive and nonconductive states of the field effect transistors.

6. The semiconductor device of claim 5, wherein the transistor voltage controller is coupled to the gate structures to control conductive and nonconductive states of the field effect transistors by modulating a common gate voltage for the gate structures.

7. The semiconductor device of claim 5, wherein:
the transistor voltage controller biases the field effect transistors into conductive states to allow the conductive inductor loop to induce loop current in the first continuous ring-shaped active region; and
the transistor voltage controller biases the field effect transistors into nonconductive states to inhibit the conductive inductor loop from inducing loop current in the first continuous ring-shaped active region.

8. The semiconductor device of claim 1, wherein the first continuous ring-shaped active region comprises source regions and drain regions such that the gate structures, the source regions, and the drain regions cooperate to form the field effect transistors.

9. An integrated inductor device comprising:
a conductive inductor loop;
a transistor arrangement comprising a first continuous ring-shaped region of active semiconductor material having source regions and drain regions defined therein, and comprising gate structures orthogonally overlying the first continuous ring-shaped region of active semiconductor material; and
dielectric material between the conductive inductor loop and the transistor arrangement, wherein the transistor arrangement serves as a voltage-modulated shield for the integrated inductor device, the voltage-modulated shield influencing an inductance of the integrated inductor device;
wherein:
the conductive inductor loop comprises a first turn and a second turn;
the first turn overlies the first continuous ring-shaped region of active semiconductor material;

the transistor arrangement further comprises a secondary ring-shaped region of active semiconductor material that is isolated from the first continuous ring-shaped region of active semiconductor material, the secondary ring-shaped region of active semiconductor material having secondary source and secondary drain regions defined therein;

the transistor arrangement further comprises secondary gate structures orthogonally overlying the secondary ring-shaped region of active semiconductor material; and the second turn overlies the secondary ring-shaped region of active semiconductor material.

10. The integrated inductor device of claim 9, further comprising a transistor voltage controller coupled to the transistor arrangement to control conductive and nonconductive states of the first continuous ring-shaped region of active semiconductor material.

11. The integrated inductor device of claim 9, further comprising a transistor voltage controller coupled to the transistor arrangement to independently control conductive and nonconductive states of the first continuous ring-shaped region of active semiconductor material and the secondary ring-shaped region of active semiconductor material.

12. The integrated inductor device of claim 9, wherein the conductive inductor loop orthogonally overlies the gate structures.

13. The integrated inductor device of claim 9, wherein:
the transistor arrangement is biased to operate in a conductive state to transform the first continuous ring-shaped region of active semiconductor material into a conductive path that accommodates loop current induced by the conductive inductor loop; and the transistor arrangement is biased to operate in a nonconductive state to transform the first continuous ring-shaped region of the active semiconductor material into a nonconductive path that inhibits formation of loop current induced by the conductive inductor loop.

14. A semiconductor device comprising:
an integrated inductor formed on a semiconductor substrate, wherein the integrated inductor comprises a conductive inductor loop, further comprising a first turn and a second turn;

a transistor arrangement, comprising a first continuous ring-shaped region of active semiconductor material having source regions and drain regions defined therein, and comprising gate structures orthogonally overlying the first ring-shaped region of active semiconductor material, wherein the transistor arrangement is formed on the semiconductor substrate to modulate loop current induced by the integrated inductor;

dielectric material to insulate the integrated inductor from the transistor arrangement; and a controller coupled to the transistor arrangement to select conductive and nonconductive operating states of the transistor arrangement, wherein a conductive operating state of the transistor arrangement allows formation of induced loop current in the transistor arrangement, and a nonconductive operating state of the transistor arrangement inhibits formation of induced loop current in the transistor arrangement;

wherein:
the first turn overlies the first continuous ring-shaped region of active semiconductor material;

the transistor arrangement further comprises a secondary ring-shaped region of active semiconductor material that is isolated from the first ring-shaped region of active semiconductor material, the secondary ring-shaped region of active semiconductor material having secondary source and secondary drain regions defined therein;

the transistor arrangement further comprises secondary gate structures orthogonally overlying the secondary ring-shaped region of active semiconductor material; and the second turn overlies the secondary ring-shaped region of active semiconductor material.

15. The semiconductor device of claim 14, wherein:
the semiconductor substrate comprises semiconductor material; and the transistor arrangement comprises an active region defined in the semiconductor material, source regions defined in the active region, drain regions defined in the active region, and gate structures formed overlying and orthogonal to the active region, such that the source regions, the drain regions, and the gate structure cooperate to form a plurality of field effect transistor coupled in series.

16. The semiconductor device of claim 14, wherein:
the semiconductor substrate comprises semiconductor material; and the transistor arrangement comprises an active region defined in the semiconductor material, a source region defined in the active region, a drain region defined in the active region, and a gate structure formed overlying and orthogonal to the active region, such that the source region, the drain region, and the gate structure cooperate to form a field effect transistor.

17. The semiconductor device of claim 16, wherein:
the controller biases the field effect transistor into a conductive state to allow the integrated inductor to induce loop current in the active region; and the controller biases the field effect transistor into a nonconductive state to inhibit the integrated inductor from inducing loop current in the active region.

18. The semiconductor device of claim 16, wherein the active region forms a continuous and contiguous ring underlying a conductive inductor loop of the integrated inductor.

19. The semiconductor device of claim 16, wherein the controller is coupled to the field effect transistor to control conductive and nonconductive states of the field effect transistor.

20. The semiconductor device of claim 19, wherein the controller is coupled to the gate structure to control the conductive and nonconductive states of the field effect transistor by modulating a gate voltage for the gate structure.

21. A non-transitory computer-readable medium having computer-executable instructions or data stored thereon that, when executed, facilitate fabrication of a semiconductor device comprising:
a layer of semiconductor material;

gate structures formed overlying the layer of semiconductor material;

a first continuous ring-shaped active region defined in the layer of semiconductor material including field effect transistors for the semiconductor device;

a layer of dielectric material formed overlying the gate structures and overlying the first continuous ring-shaped active region;

a conductive inductor loop formed overlying the layer of dielectric material, wherein the field effect transistors are controlled to modulate inductance associated with the conductive inductor loop;

a secondary ring-shaped region of active semiconductor material that is isolated from the first continuous ring-shaped active region, the secondary ring-shaped region of active semiconductor material having secondary source and secondary drain regions defined therein; and a plurality of secondary gate structures orthogonally overlaying the secondary ring-shaped region of active semiconductor material;

wherein:

the conductive inductor loop comprises a first turn and a second turn;

the first turn overlies the first ring-shaped region of active semiconductor material; and the second turn overlies the secondary ring-shaped region of active semiconductor material.

22. The non-transitory computer-readable medium of claim 21, wherein the computer-executable instructions or data comprise Graphic Database System (GDS) data files.

23. The non-transitory computer-readable medium of claim 21, wherein the computer-executable instructions or data represent layout designs for photolithography masks utilized to fabricate the conductive inductor loop.

24. The non-transitory computer-readable medium of claim 23, wherein the layout designs for the photolithography masks define the conductive inductor loop such that:

the conductive inductor loop resides in a first plane; and a projection of the conductive inductor loop onto a reference plane that is parallel to the first plane falls within a projection of the first continuous ring-shaped active region onto the reference plane.

25. The non-transitory computer-readable medium of claim 21, wherein the computer-executable instructions or data represent layout designs for photolithography masks utilized to fabricate the gate structures and the field effect transistors.

26. The non-transitory computer-readable medium of claim 25, wherein the layout designs for the photolithography masks define the gate structures such that each gate structure has a major longitudinal axis that is perpendicular to the conductive inductor loop.

* * * * *